US010237100B2

(12) United States Patent
Petrovic et al.

(10) Patent No.: US 10,237,100 B2
(45) Date of Patent: *Mar. 19, 2019

(54) METHOD AND APPARATUS FOR DIGITIZATION OF BROADBAND ANALOG SIGNALS

(71) Applicant: Entropic Communications LLC, Carlsbad, CA (US)

(72) Inventors: Branislav Petrovic, Carlsbad, CA (US); Itzhak Gurantz, Carlsbad, CA (US)

(73) Assignee: Entropic Communications LLC, Carlsbad, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 15/977,844

(22) Filed: May 11, 2018

(65) Prior Publication Data

US 2018/0262375 A1    Sep. 13, 2018

Related U.S. Application Data

(63) Continuation of application No. 14/838,028, filed as application No. PCT/US2014/018196 on Feb. 27, 2014, now Pat. No. 9,979,574.

(60) Provisional application No. 61/770,208, filed on Feb. 27, 2013.

(51) Int. Cl.
*H04L 27/02* (2006.01)
*H04L 27/08* (2006.01)
*H04B 1/00* (2006.01)
*H03M 1/12* (2006.01)

(52) U.S. Cl.
CPC .............. *H04L 27/08* (2013.01); *H03M 1/12* (2013.01); *H04B 1/00* (2013.01)

(58) Field of Classification Search
CPC ...... H03G 3/32; H03G 5/165; H04L 27/3809; H04L 5/00
USPC ...................... 375/345, 240; 455/67.11, 3.02
See application file for complete search history.

(56) References Cited

U.S. PATENT DOCUMENTS

| 5,231,660 A | 7/1993 | West, Jr. |
| 5,809,395 A | 9/1998 | Hamilton-Piercy |
| 6,018,644 A | 1/2000 | Minarik |
| 2002/0193067 A1 | 12/2002 | Cowley |
| 2005/0130597 A1 | 6/2005 | Li |

(Continued)

OTHER PUBLICATIONS

International Search Report for International Application No. PCT/US2014/018196.

*Primary Examiner* — Shuwang Liu
*Assistant Examiner* — Fitwi Hailegiorgis
(74) *Attorney, Agent, or Firm* — McAndrews, Held & Malloy

(57) ABSTRACT

Methods and systems for digitization of broadband analog signals may comprise in a radio frequency (RF) transceiver comprising a diplexer, first and second automatic gain and slope control (ASCS) modules, and a combiner): receiving an input RF signal comprising at least two signals, splitting the input RF signal in the frequency domain into first and second signals of different frequency utilizing the diplexer, configuring a frequency-dependent gain level for each of the first and second signals utilizing the first and second ASCS modules, and combining output signals from the first and second ASCS modules utilizing the combiner. The frequency dependent gain levels of the first and second signals may be configured to enable an ADC receiving the combined signal to operate with an effective number of bits (ENOB) of approximately 10.

20 Claims, 9 Drawing Sheets

(56) References Cited

U.S. PATENT DOCUMENTS

2008/0240230 A1  10/2008  Oxman
2010/0040178 A1   2/2010  Sutton
2010/0162340 A1   6/2010  Riggsby
2013/0279914 A1  10/2013  Brookds

METHOD AND APPARATUS FOR DIGITIZATION OF BROADBAND ANALOG SIGNALS

CROSS-REFERENCE TO RELATED APPLICATIONS/INCORPORATION BY REFERENCE

This application is a continuation of application Ser. No. 14/838,028 filed on Aug. 27, 2015, which is the National Stage of PCT Application No. PCT/US2014/018196 filed Feb. 27, 2014, which claims priority from United States Provisional Application entitled "Multi-Band Broadband Receiver," Ser. No. 61/770,208, filed Feb. 27, 2013. Each of the above identified applications is hereby incorporated herein by reference in its entirety.

FIELD

Certain embodiments of the disclosure relate to communication. More specifically, certain embodiments of the disclosure relate to a method and system for digitization of broadband analog signals.

BACKGROUND

Designers of broadband receivers face several challenges today. One such challenge is presented by the very nature of broadband receivers. That is, in many of the communications systems of today, receivers are required to digitize incoming signals over a broad frequency range. These signals may have very different power levels. For the purpose of this discussion, the term "power level" is used broadly to refer to either the amount of power in a particular frequency band (i.e., power density) or the amount of power over the entire band used by the particular received signal (i.e., total signal power). In addition, a "signal" is defined as the energy within a frequency band that is used to represent information (i.e., "content") being communicated from a transmission source to the receiver. Accordingly, a receiver may receive several signals, some such signals from the same transmission source, each such signal using a different frequency band, and some such signals from different transmission sources using different frequency bands.

Further limitations and disadvantages of conventional and traditional approaches will become apparent to one of skill in the art, through comparison of such systems with some aspects of the present invention as set forth in the remainder of the present application with reference to the drawings.

BRIEF SUMMARY

A system and/or method for digitization of broadband analog signals substantially as shown in and/or described in connection with at least one of the figures, as set forth more completely in the claims.

Various advantages, aspects and novel features of the present disclosure, as well as details of an illustrated embodiment thereof, will be more fully understood from the following description and drawings.

DETAILED DESCRIPTION

Figure 1:
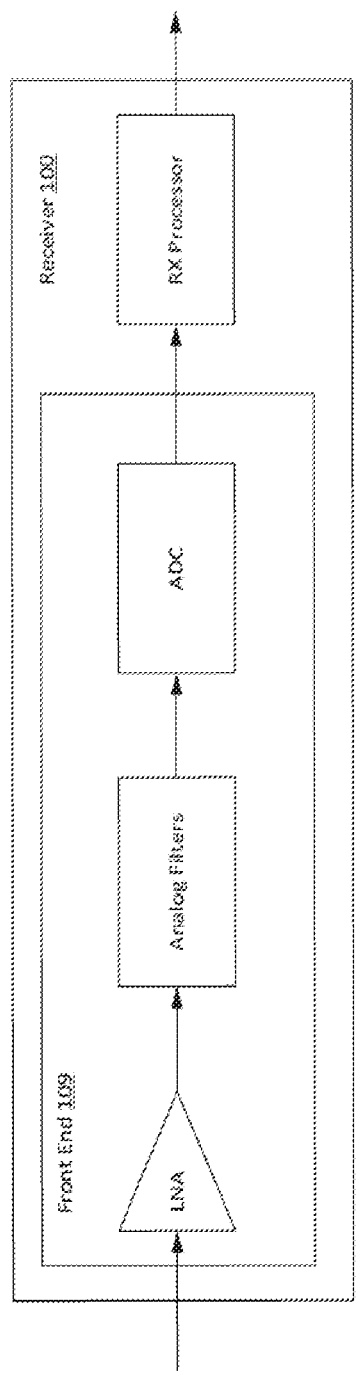
FIG. 1 is a simplified block diagram of a receiver.

Certain aspects of the disclosure may be found in a method and system for digitization of broadband analog signals. Exemplary aspects may comprise in a radio frequency (RF) transceiver comprising a diplexer, first and second automatic gain and slope control (ASCS) modules operating over first and second frequency ranges, a combiner, and an analog to digital converter (ADC): receiving an input RF signal comprising at least two signals, splitting the input RF signal in the frequency domain into first and second signals of different frequency utilizing the diplexer, configuring a frequency-dependent gain level for each of the first and second signals utilizing the first and second ASCS modules, combining output signals from the first and second ASCS modules utilizing the combiner, and converting the combined output signals to a digital signal utilizing the ADC. The frequency dependent gain levels of the first and second signals may be configured to enable the ADC to operate with an effective number of bits (ENOB) of approximately 10. The frequency dependent gain levels of the first and second signals may be configured to result in equal error margins for each signal. The frequency dependent gain levels of the first and second signals may be configured to result in equal total signal power for each signal. The frequency dependent gain levels of the first and second signals may be configured to result in equal power density for each signal. The frequency dependent gain levels of the first and second signals may be configured based on a type of modulation of the first and second signals. The ASCS modules may comprise one or more of: low noise amplifiers, variable gain amplifiers, and step attenuators. The frequency dependent gain levels of the first and second signals may be dynamically configured. The first signal may comprise a Multimedia over Coax Alliance (MoCA) signal and the second signal may comprise a cable television signal. The MoCA signal may be time-duplexed with an output MoCA signal from a transmitter in the RF transceiver.

As utilized herein the terms "circuits" and "circuitry" refer to physical electronic components (i.e. hardware) and any software and/or firmware ("code") which may configure the hardware, be executed by the hardware, and or otherwise be associated with the hardware. As used herein, for example, a particular processor and memory may comprise a first "circuit" when executing a first one or more lines of code and may comprise a second "circuit" when executing a second one or more lines of code. As utilized herein, "and/or" means any one or more of the items in the list joined by "and/or". As an example, "x and/or y" means any element of the three-element set {(x), (y), (x, y)}. In other words, "x and/or y" means "one or both of x and y". As another example, "x, y, and/or z" means any element of the seven-element set {(x), (y), (z), (x, y), (x, z), (y, z), (x, y, z)}. In other words, "x, y and/or z" means "one or more of x, y and z". As utilized herein, the term "exemplary" means serving as a non-limiting example, instance, or illustration. As utilized herein, the terms "e.g.," and "for example" set off lists of one or more non-limiting examples, instances, or illustrations. As utilized herein, circuitry is "operable" to perform a function whenever the circuitry comprises the necessary hardware and code (if any is necessary) to perform the function, regardless of whether performance of the function is disabled or not enabled (e.g., by a user-configurable setting, factory trim, etc.).

In one example of the disclosed method and apparatus, a broadband receiver is used to receive both multimedia over coax alliance (MoCA) signals and cable television (CATV) signals. In another example, MoCA and Wi-Fi signals are received by the same receiver. The disclosed method and apparatus, however, can be used to receive any number and combination of signal types.

FIG. 1 is a simplified block diagram of a receiver 100. A low noise amplifier (LNA) 102 initially receives the incoming signals. The LNA 102 amplifies the signals. The output from the LNA 102 is the coupled to the input of a set of analog filters 104. These analog filters 104 ensure that energy outside the desired frequency band is removed before further processing of the signals.

In many instances, the receiver 100 is required to receive signals modulated across more than one frequency band. For example, in one such case, the receiver receives Multimedia over Coax Alliance (MoCA) signals and Cable Television (CATV) signals. MoCA signals are received within one frequency band (e.g. 1125 MHz-1675 MHz) and CATV signals are received within another frequency band (e.g. 54 MHz-1002 MHz). The analog filters 104 ensure that all of the energy of each of the MoCA and CATV signals pass while blocking as much other energy as possible that might otherwise interfere with the proper reception and processing of these desired signals.

The filtered signals are then output from the analog filters 104 to an analog to digital converter (ADC) 106. The ADC 106 takes the received filtered analog signals and generates a digital representation of these received signals. The digital representation of the analog input takes the form of a series of digital values that each indicate the amplitude of the analog signal at a particular point in time. The combination of the LNA 102, analog filters 104 and ADC 106 comprise the receiver front end 109.

The digital output from the ADC 106 is then coupled to a Receive (RX) processor 108. The RX processor 108 performs whatever processing is desired for the received signals. For example, the RX processor 108 might process the signals to extract viewable video content and prepare that content for display on a monitor (not shown).

One problem that occurs in some systems comes from the fact that receive signals may each have very different power levels. That is, the strength of the signals received from different sources may be very different. For example, in systems that receive both CATV and MoCA signals, the minimum CATV signal can be as low as −71 dBm in a 6 MHz bandwidth. The maximum MoCA power can be as high as −2 dBm in 50 MHz bandwidth. That equates to about −11 dBm in 6 MHz bandwidth. Accordingly, the difference in the power density between the MoCA and CATV signals can be as much as −11−(−71)=60 dB.

In such cases in which the signals have different power levels, the ADC 106 must generally have a very large dynamic range. That is, the ADC 106 must generally be able to handle very powerful signals, and at the same time provide very fine resolution for signals that have relatively low signal strength. This poses a challenge to the design of ADCs. The strongest signals will require the highest order bit of the digital value representing the output of the ADC 106 to represent a relatively high amplitude. However, in order to achieve the required resolution for very weak signals, the number of bits used by the ADC 106 must be very large (in many cases, too large to be practical). Therefore, the signals must generally be separated and processed independently, increasing the cost of the receiver.

The ADC in accordance with the present disclosure can digitize strong and weak signals from different sources without compressing the large signals and still maintaining a high resolution for weaker signals.

Figure 2:
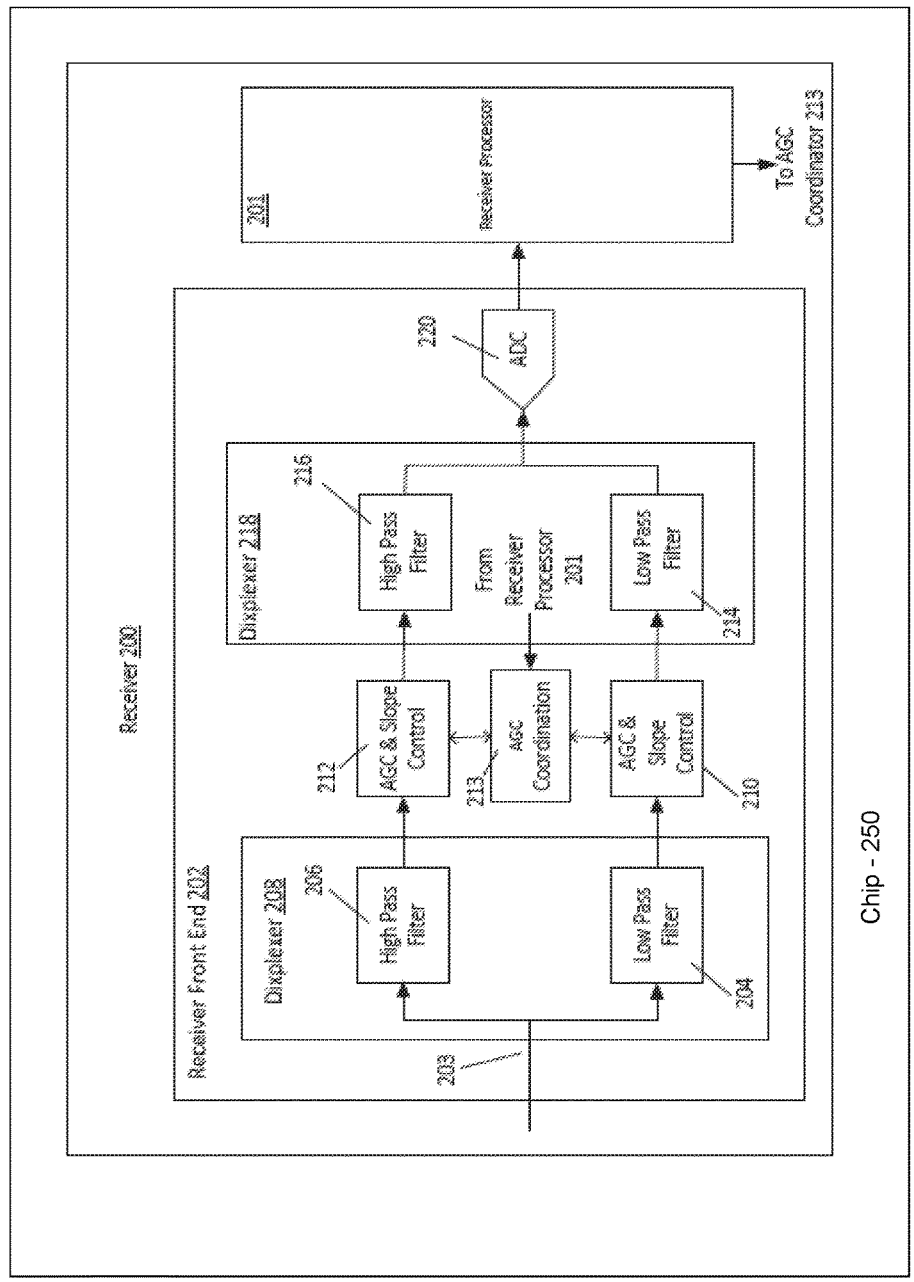
FIG. 2 is a simplified block diagram of a receiver in accordance with one example embodiment of the disclosed method and apparatus.

FIG. 2 is a simplified block diagram of a receiver 200 comprising a receive (RX) processor 201 coupled to a receiver front end 202 in accordance with one embodiment of the disclosed method and apparatus. The receiver 200 may be integrated on a single chip 250, such as a CMOS chip, for example. An input composite signal 203 comprising two signal types is received and split into two bands (one band for each signal type) by a low pass filter (LPF) 204 and a high pass filter (HPF) 206. The LPF 204 and HPF 206 taken together form a diplexer 208 at the input to the receiver front end 202.

In accordance with one embodiment, the LPF 204 and HPF 206 have non-overlapping passbands. In an alternative embodiment, the LPF 204 and/or HPF 206 can be replaced by bandpass filters (BPFs) having non-overlapped bands. The output from the LPF 204 is coupled to a first AGC & Slope Control stage (ASCS) 210. Likewise, the output from the HPF 206 is coupled to a second ASCS 212. In one embodiment of the disclosed method and apparatus, the ASCS is an automatic gain control (AGC) circuit without slope control. The signals that are input to each ASCS 210, 212 are conditioned to equalize the levels of the signals at the point at which the signals are recombined. In accordance with one embodiment of the disclosed method and apparatus, an AGC Coordination module 213 operates with the ASCS 210, 212 to provide necessary coordination between the ASCSs 210, 212 to perform the conditioning. More information about the manner in which the signals are conditioned will be provided below.

The output from the first ASCS 210 is coupled to a second LPF 214. Similarly, the output from the second ASCS 212 is coupled to a second HPF 216. The second LPF 214 and the second HPF 216 form a second diplexer 218. The second diplexer 218 serves as a recombiner. The recombiner can take several different forms. The diplexer 218 that is disclosed in FIG. 2 is merely shown as one example of a recombiner. Accordingly, the output from the second LPF 214 is diplexed with the output from the second HPF 216. The combined signals output from the diplexer 218 are sampled by a common ADC 220. The conditioning of the signals within the first and second ASCS 210, 212 allows the ADC 220 to operate with a lower dynamic range than would otherwise be possible if the signals were not conditioned.

The details regarding the manner in which the signals are conditioned are described in more detail below.

The disclosed method and apparatus allows two bands having very different signal levels to be digitized with a common (shared) ADC 220. This is accomplished, for example, by (1) separating the signals in the frequency domain, (2) performing AGC and slope control (i.e. adjusting the gain with respect to frequency across the band of interest, sometimes referred to as the Nyquist band; AGC and slope control are performed separately on each of the signals that comprise the composite input signal); and then (3) recombining the signals prior to digitizing the recombined composite signal within the ADC 220. This method lowers the ADC dynamic range requirements.

Each ASCS 210, 212 may include LNAs and/or variable gain amplifiers and/or step attenuators. In accordance with one embodiment of the method and apparatus of FIG. 2, both the first and second ASCS 210, 212 are adjusted together to ensure that the receiver can acquire the received signals. That is, the gain of the signals that are output from each ASCS 210, 212 of the receiver front end 202 are appropriately adjusted to allow a demodulator (not shown) within a RX processor 201 to properly demodulate the received signals. If the gain is too high, the ADC 220 will saturate and if the gain is too low, the resolution of the ADC 220 will not be sufficient to allow the RX processor 201 to demodulate the signals. In accordance with one embodiment of the disclosed method and apparatus, the AGC Coordination module 213 controls each ASCS 210, 212 to provide gain control instructions.

Once the received signals are acquired, the gain applied by each ASCS 210, 212 to the signals conditioned by each ASCS 210, 212 is cooperatively adjusted. In one embodiment of the disclosed method and apparatus, it is desirable to condition the signals by adjusting the gain of each ASCS 210, 212 such that there is an equal margin above an error threshold (i.e., error margin), as is further explained with reference to FIG. 3 and FIG. 4. The term "cooperatively adjusted" means that the gain of each ASCS 210, 212 may be adjusted to a different level and at different times, but that the effect of each signal is taken into account when adjusting the other. In accordance with one embodiment of the disclosed method and apparatus, the AGC Coordination module 213 provides feedback and control regarding the amount of gain that is required to achieve the goals of the ASCS 210, 212, such as achieving approximately equal error margins for each signal.

Figure 3:
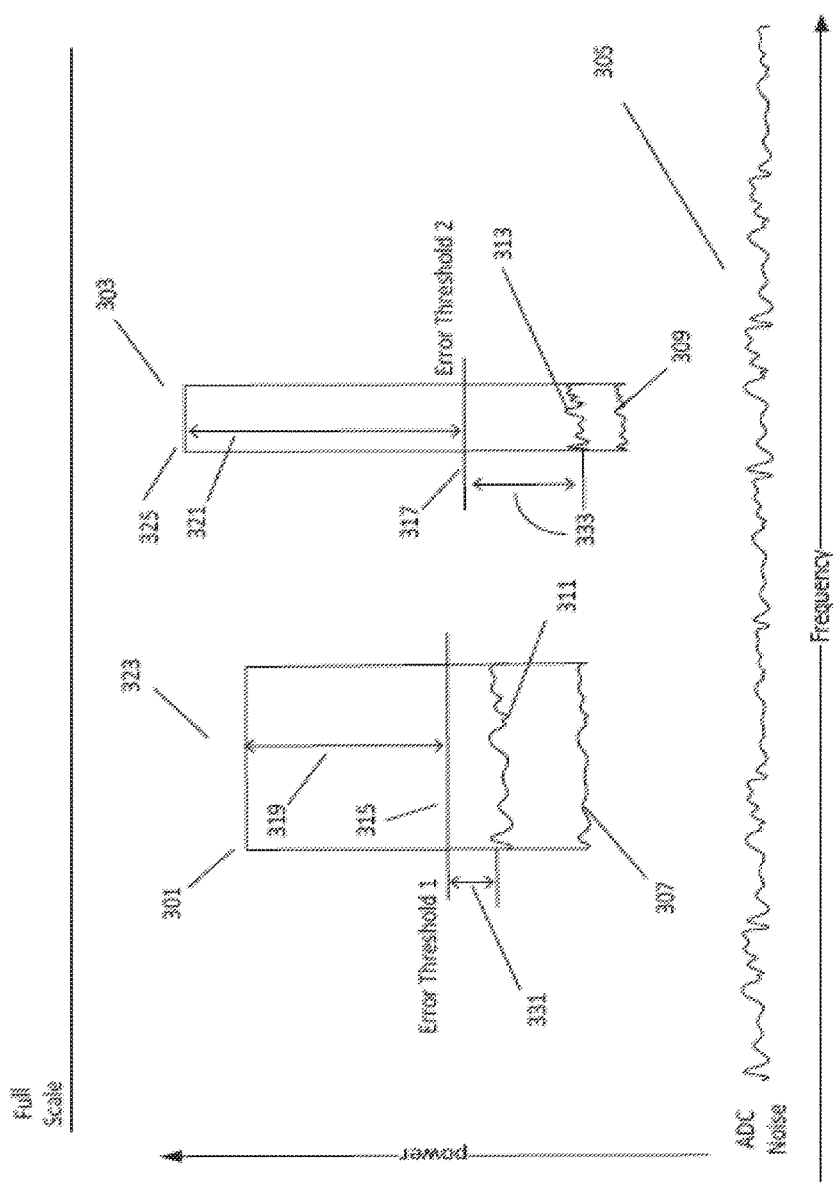
FIG. 3 shows power with respect to frequency for two received signals.

FIG. 3 shows power with respect to frequency for two received signals 301, 303. Also shown is a noise level 305 that is created by the noise generated within the front end 202. This noise 305 is predominately generated in the ADC 220. However, there are other components that are less significant, such as the distortion created by the group delay of the filters 204, 206, 214, 216, as well as distortion from the ASCS 210, 212. In addition to the noise 305 that is generated within the front end 202, noise 307, 309 is received with each signal. The front end noise 305 sums with the received noise 307, 309 to generate a combined (total) noise level 311, 313. The ratio of signal level 323, 325 and total noise 311, 313 is the Signal to Noise Ratio (SNR) presented to demodulator. The SNR is higher than a certain threshold in order to demodulate the information modulated on the signals accurately (i.e., without errors). The minimum SNR level that is used to ensure that no more than an acceptable level of errors will occur is referred to herein as the "SNR threshold" 319, 321. A corresponding noise level is "Error Threshold" 315, 317.

There is a unique error threshold 315, 317 associated with each of the received signals. The error threshold will depend in part upon the type of modulation that is used to modulate the information carried by each signal. For example, a signal that is modulated with quadrature phase shift keying (QPSK) will generally have a lower error threshold than a signal that is modulated with quadrature amplitude modulation (QAM) 32. That is, due to the greater symbol density (number of symbols that can be represented in the same bandwidth) a greater signal to noise ratio is used to demodulate the content (i.e., accurately detect transmitted symbols).

The distance between the error threshold 315, 317 and the respective total noise level 311, 313 is what is referred to herein as the "error margin" 331, 333, respectively. Since the relationships between the various noise components and the signal are not linear, changes in the gain applied to the signal by the ASCS 210, 212 will change the error margin. By adjusting the gain of each of the received signals 301, 303 with respect to frequency, the error margins of each of the received signals 301, 303 can be made to be equal. The gain can be adjusted dynamically (on a continuous basis) based on feedback from the receiver processor 201 to the AGC Coordination module 213 regarding the relative sizes of the error margins associated with each received signal. This ensures that neither of the signals is favored by the AGC conditioning performed by the ASCS 210, 212. Furthermore, in accordance with one embodiment of the disclosed method and apparatus, slope adjustments are made (as will be clear from the fact that the gain is controlled as a function of frequency across the frequency band used by each signal).

Figure 4:
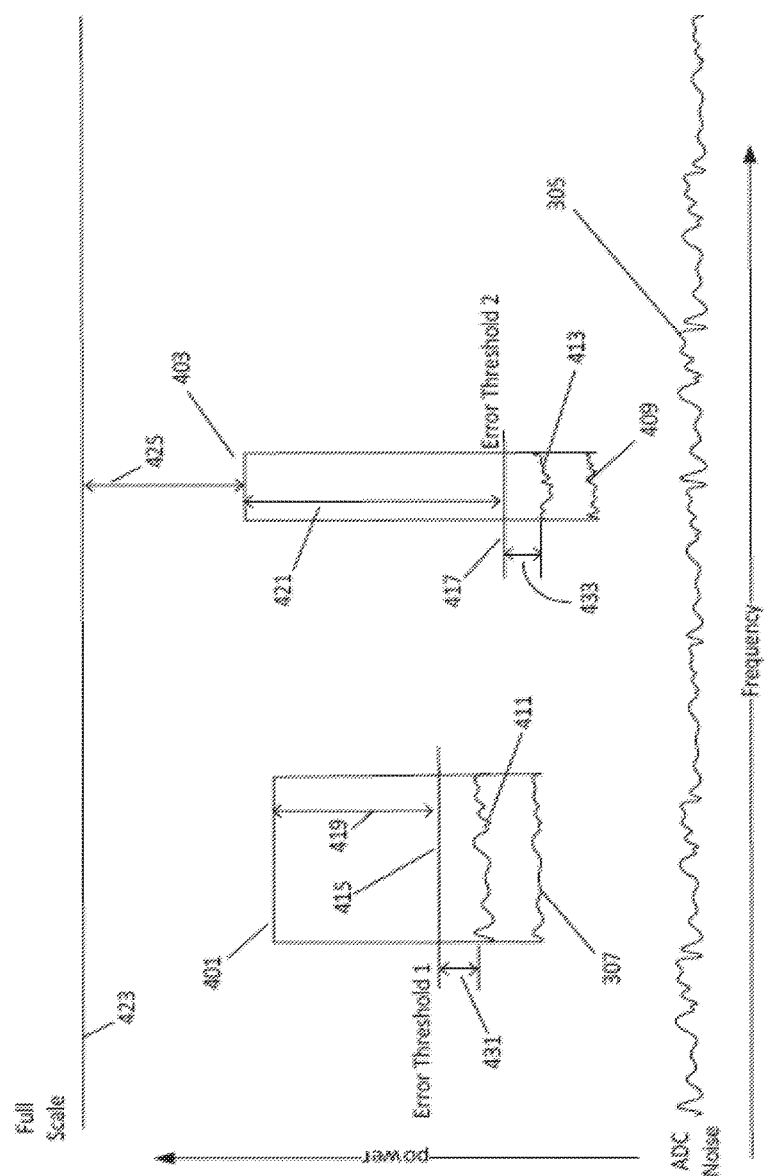
FIG. 4 shows the two signals of FIG. 3 but with gain adjustments.

It should be noted that the error margins 331, 333 for the two signals 301, 303 shown in FIG. 3 are not equal. In contrast, FIG. 4 shows the two signals 301, 303 of FIG. 3 but with gain adjustments. The gain adjusted signals 401, 403 of FIG. 4 have equal error margins 431, 433 as an effect of the gain adjustment. Furthermore, it can be seen that the dynamic range of the ADC 220 is improved. That is, there is more headroom 425 between the top of each signal 401, 403 and the full scale limit 423 of the ADC 220 than was the case prior to the gain adjustment. It should be noted that the illustrations of FIGS. 3 and 4 are merely for the purpose of aiding in understanding the disclosed embodiments and are not to scale. In many cases, the difference between the strength of the signals received will be many orders of magnitude.

Figure 5:
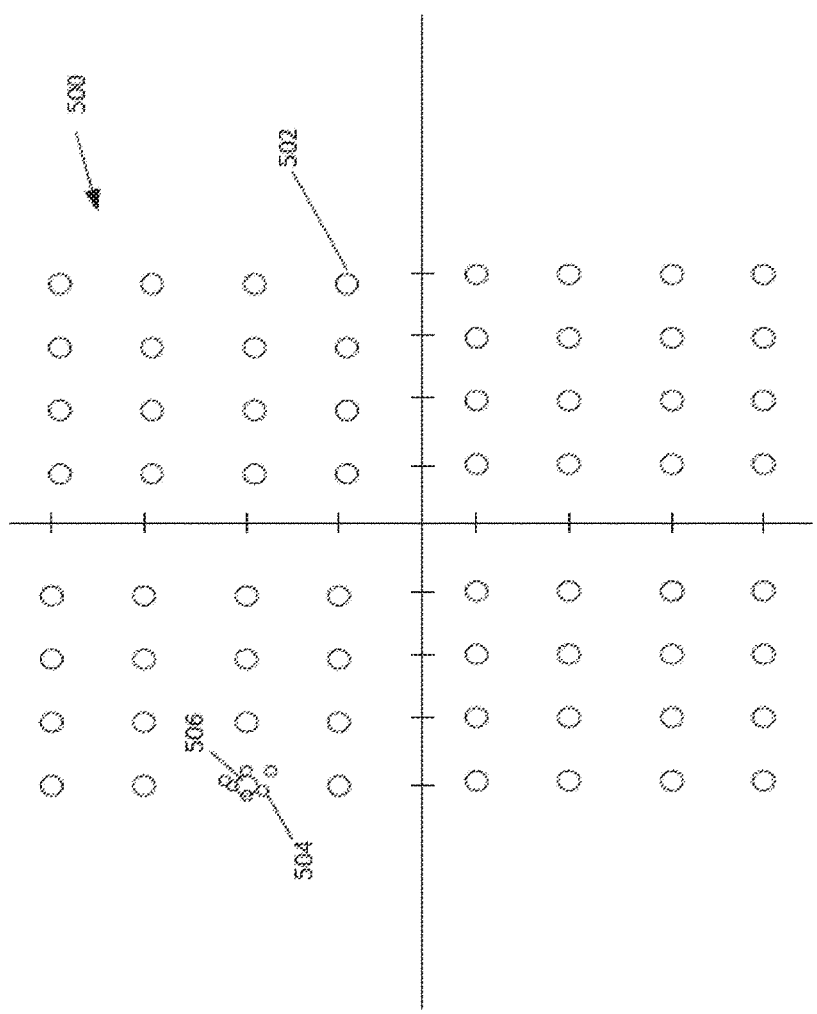
FIG. 5 is an illustration of an example symbol constellation.

The error margin for each signal can be estimated as follows. FIG. 5 is an illustration of an example symbol constellation 500. Each point 502 in the constellation 500 represents a symbol. The abscissas represents the amplitude of an in-phase component of the received signal. The ordinate represents the amplitude of a quadrature-phase component of the received signal. The example constellation shown in FIG. 5 is a QAM 64 constellation. When a symbol is received, the symbol should fall directly in the center of one of the points 502. However, due to noise from various sources, there is distortion in the symbol and it will typically lie at some distance from the center of the ideal point 502. Since the noise is random, the particular location of the symbol within the constellation will vary randomly. Six symbols 504 are shown scattered around the point 506 as examples of six attempts to receive a symbol that ideally would lie in the center of point 506. The lower the signal to noise ratio, the further the received symbol will be from the center of the ideal point 506. By measuring the distance of each such symbol 504 from the center of the ideal point 506, the amount of distortion (i.e., signal to noise ratio) can be measured. Furthermore, a determination can be made as to how far a symbol can deviate from the center of the ideal point 506 before it is unclear whether the symbol transmitted was intended to be at the center of the ideal point 506 or an adjacent point. That determination together with some margin of safety determines the error margin. This explanation is provided merely to demonstrate one way in which the error margin can be measured and understood. However, there are several other ways to determine the error margin that are well known to those skilled in the art.

As noted above, in one example embodiment of the disclosed method and apparatus, the goal of the ASCS 210, 212 is to set the error margin to be equal for each of the received signals. In an alternative example embodiment, the goal is to make the total signal power of each signal equal. As an example, total signal power is the total power over the band used to communicate the transmitted signal. One signal may have a lower instantaneous power, but a broader bandwidth and have the same total signal power as another signal that has a higher instantaneous power but over a narrower bandwidth. In yet another embodiment, the goal of the ASCS 210, 212 is to equalize the power density of the received signals. The power density is the total power in a specified bandwidth. Accordingly, the result of equalizing the power density is that the amount of power in a specified bandwidth (e.g., 6 MHz) output from each ASCS are equal.

In one embodiment, the slope control is omitted in the top or both arms. Gain control generally is still implemented in both ASCSs 210, 212. However, in another embodiment, gain control is implemented in only one of the arms. Accordingly, one of the ASCSs can be omitted. The embodiment is of particular interest when the bandwidth is narrower. In another embodiment, the output diplexer 218 is replaced with a signal combiner (not shown).

Figure 6:
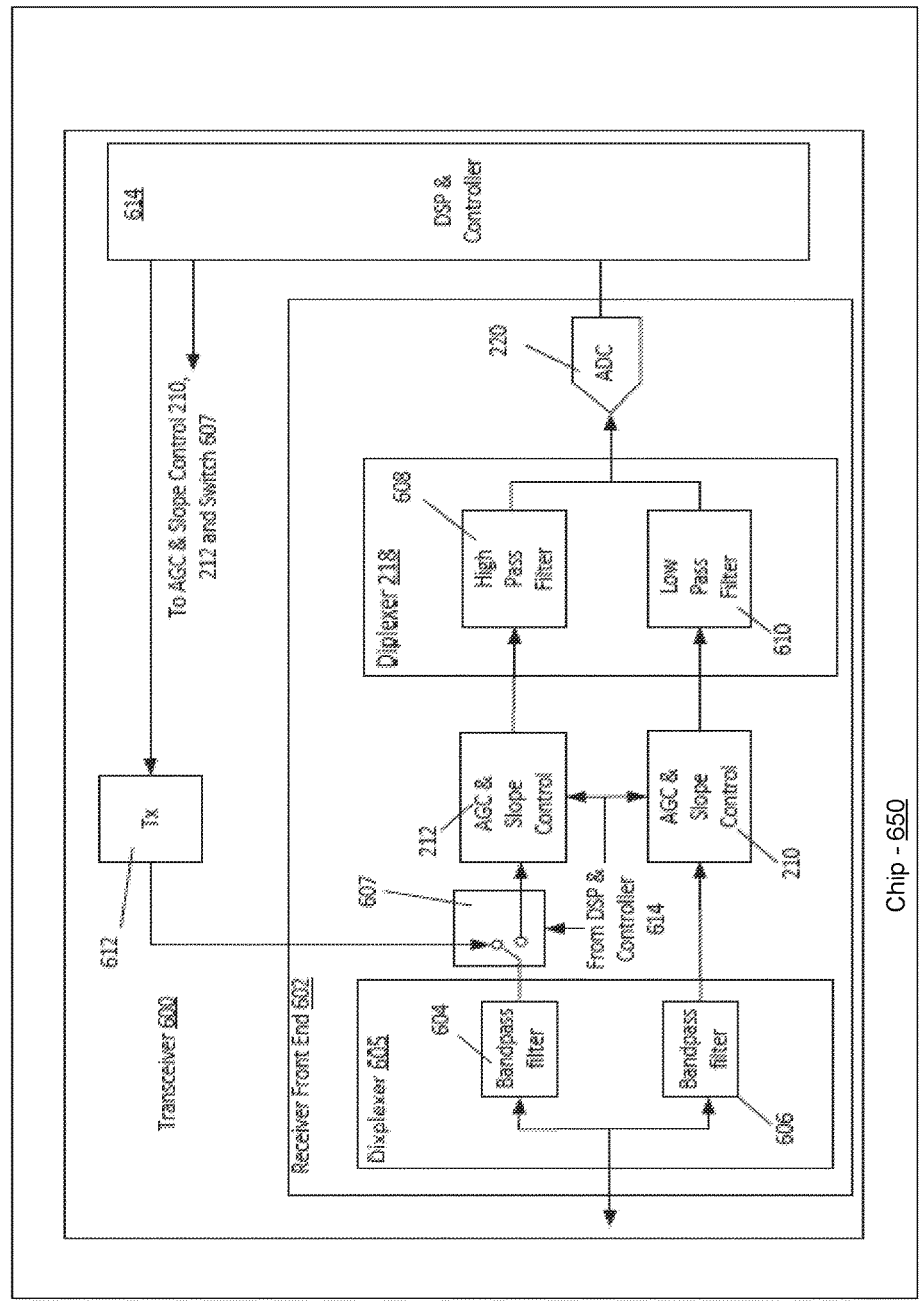
FIG. 6 shows an example embodiment of the disclosed method and apparatus in which a switch is used to time-duplex the receive and transmit functions of a transceiver.

FIG. 6 shows an example embodiment of the disclosed method and apparatus in which a switch is used to time-duplex the receive and transmit functions of a transceiver. A transceiver 600 comprises a receiver front end 602 in accordance with one example embodiment of the disclosed method and apparatus in which filters 604, 606, 608, 610 are tuned for MoCA and CATV broadband reception, respectively. The transceiver 600 further comprises a transmitter 612 and a digital signal processor (DSP) & controller 614. The transceiver 600 may be integrated on a single chip 650, such as a CMOS chip, for example.

A composite signal having both MoCA and CATV signals is applied to a first diplexer 605. The MoCA signal passes through a first bandpass filter 604 within the diplexer 605. The transmitter 612 is time-duplexed with the receiver front end 602 by a Rx/Tx switch 607. In accordance with one embodiment, the switch 607 is controlled by the DSP & Controller 614. In an alternative embodiment, the switch 607 detects when there is no signal present from the transmitter 612 and switches to connect the output of bandpass filter 604 to the input of ASCS 212. In accordance with one embodiment, slope/AGC control is provided by the DSP & controller 614. A Channel level profile for the CATV signals is measured and the slope control circuit is adjusted for minimum slope/ripple in the CATV band.

The CATV signal passes through a second bandpass filter 606. The top two filters 604, 608 provide isolation and protect the lower arm from the impedance changes caused by the switching action, thus preventing signal variation in the lower arm during and after the switchover.

The gain in both arms are adjusted for best match of spectral power density of MoCA and CATV signals (i.e., to achieve equal error margins as noted above or targeting the goal of achieving an equal, flat spectral density profile) at the combined point at the ADC input. In one embodiment, the adjustment to the gain is made as a function of frequency in order to adjust for any slope in the frequency response across the frequency band of a signal. Alternatively, the gain adjustment is adjusted at a constant level over the band of each signal.

This gain adjustment allows the ADC 220 to operate with an "Effective Number of Bits" (ENOB) of approximately 10. ENOB is a measure of the dynamic performance of an ADC and its associated circuitry. The resolution of an ADC is specified by the number of bits used to represent the analog value, in principle giving 2N signal levels for an N-bit signal.

Without equalization, several more bits of ENOB could be required. Such an increase in ENOB may not be feasible with current state of the art ADCs. A sampling clock above 3.4 GHz can sample the combined bands. 3.4 GHz is twice the highest frequency to be digitized and so is in accordance with Nyquist sampling theorem. Lower sampling frequencies are possible if complex (I, Q) bandpass sampling is used.

Often the frequency profile includes ripple (in addition to a linear slope), thus higher order slope equalizers can achieve better equalization than a lower (e.g. first) order correction. In one embodiment of the disclosed method and apparatus, multiple equalizers with different slopes are switched in and out. The signal is routed via the particular selected combination of such equalizers. In another embodiment, the circuits are cascaded to obtain higher order equalization. In another embodiment, a variable gain amp is in front or in-between the equalizer circuits. The variable amp can include a switched-capacitor step attenuator.

In actual home installations, CATV levels at TV outlets can exceed the governing specifications, such as SCTE40 or DOCSIS/Open Cable—these specs call for the levels between −15 dBmV and +15 dBmV, but the actual levels may be in the range between −22 dBmV (−71 dBm) and +20 dBmV (−29 dBm), which includes ripple plus up or down slope of up to 30 dB; equalizing the slope and levels reduce the dynamic range requirement of the broadband digitizer ADC. For example if the ripple/slope is reduced from 30 dB to 10 dB (in analog/RF domain before sampling), it will save more than 3 bits of the required ADC dynamic range.

Figure 7:
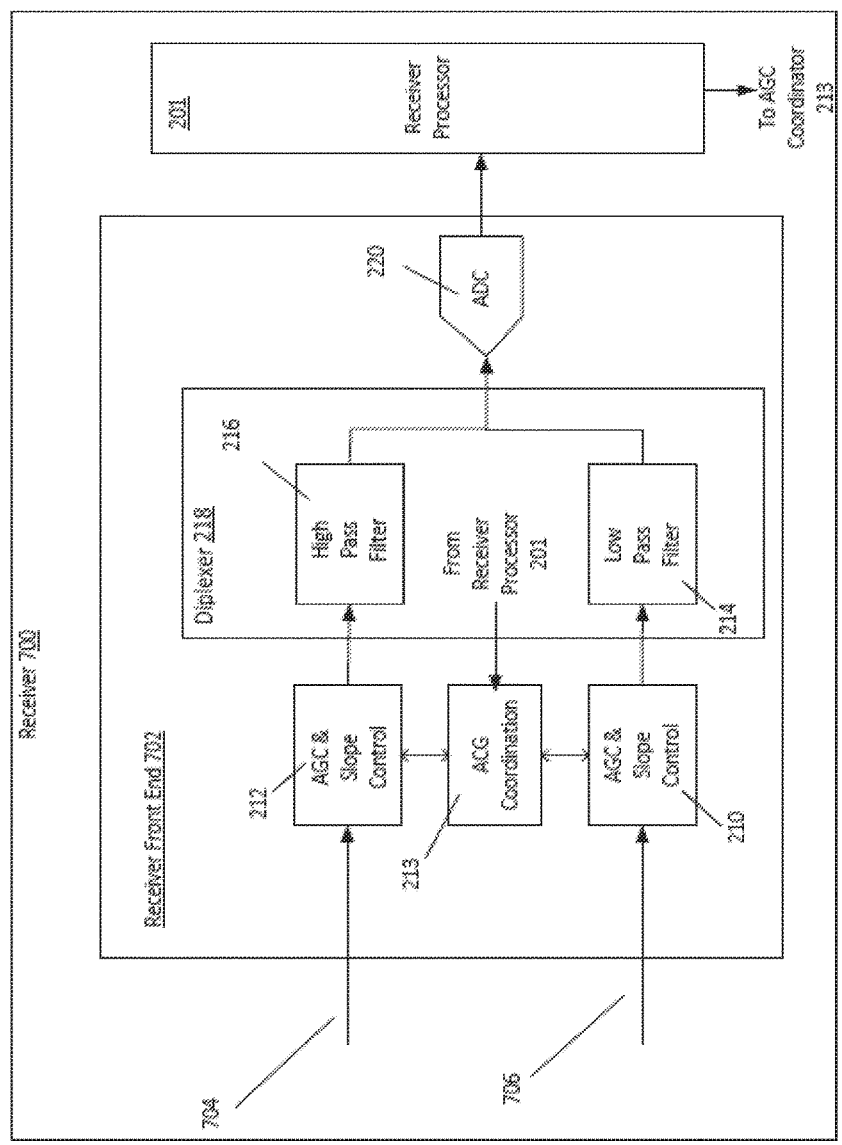
FIG. 7 is an illustration of an example embodiment in which a first signal is coupled to a front end of a receiver over a first medium and a second signal is coupled to the front end over a second medium.

FIG. 7 is an illustration of an example embodiment in which a first signal (such as a MoCA signal) is coupled to a front end 702 of a receiver 700 over a first medium 704 (such as coaxial cabling) and a second signal (such as a WiFi signal) is coupled to the front end 702 over a second medium 706 (such as an Ethernet cable). This embodiment is essentially identical to the embodiment shown in FIG. 2. However, the first diplexer 208 shown in FIG. 2 is not needed, since the first and second signals are already separated. The ASCS 210, 212 operate as noted above with respect to the discussion regarding FIG. 2.

Figure 8:
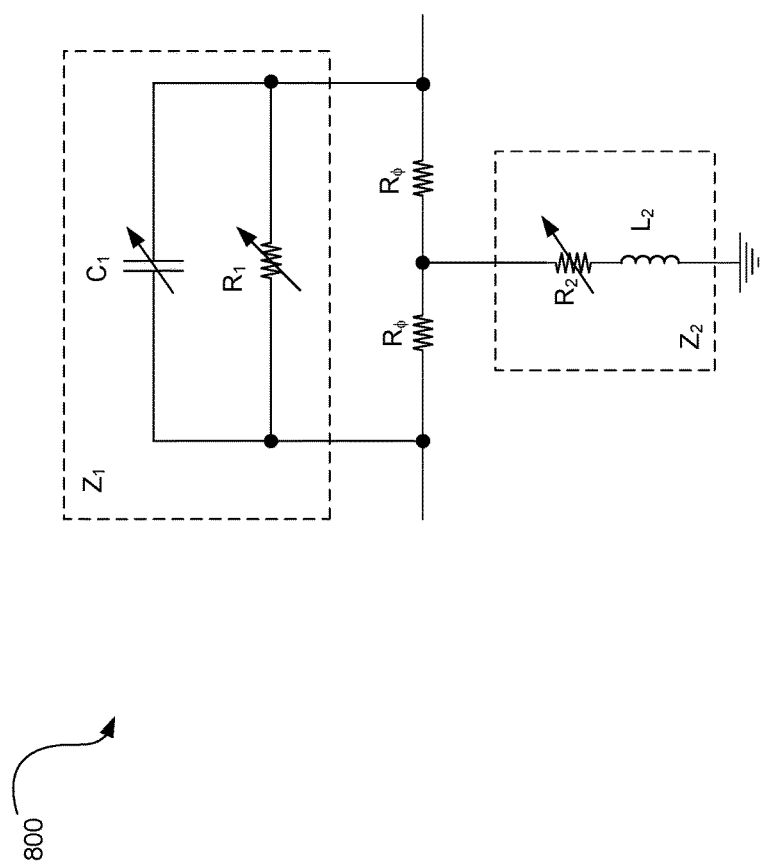
FIG. 8 is an illustration of a variable slope control circuit in accordance with an example embodiment of the disclosure.

FIG. 8 is an illustration of a variable slope control circuit in accordance with an example embodiment of the disclosure. Referring to FIG. 8, there is shown a first order bridged-T variable equalizer 800 with up-slope response. The equalizer 800 may be integrated in the ASCS 210 and/or 212 and may comprise impedance $Z_1$ in parallel with the resistors $R_\phi$, where the impedance $Z_2$ comprises the lower leg of the "T" structure. The impedance $Z_1$ may comprise variable capacitor $C_1$ and resistor $R_1$. The impedance $Z_2$ may comprise inductor $L_2$ and variable resistor $R_2$.

In an example scenario, $Z_1 \cdot Z_2 = R_\phi^2 = R_1 \cdot R_2$ and $R_1 \cdot C_1 = L_2/R_2$. In instances of reduced equalizer range, some variable components may instead be fixed. The variable capacitors and resistors may comprise switched capacitor/resistor circuits on the chip comprising the receiver 200, the transceiver 600, and/or the receiver 700, and may be configured by the receiver processor 201, for example, thereby enabling dynamic frequency-dependent gain control of the ASCS 210 and/or 212. In another example scenario, one or more of the inductors, capacitors, or resistors may be off-chip.

Figure 9:
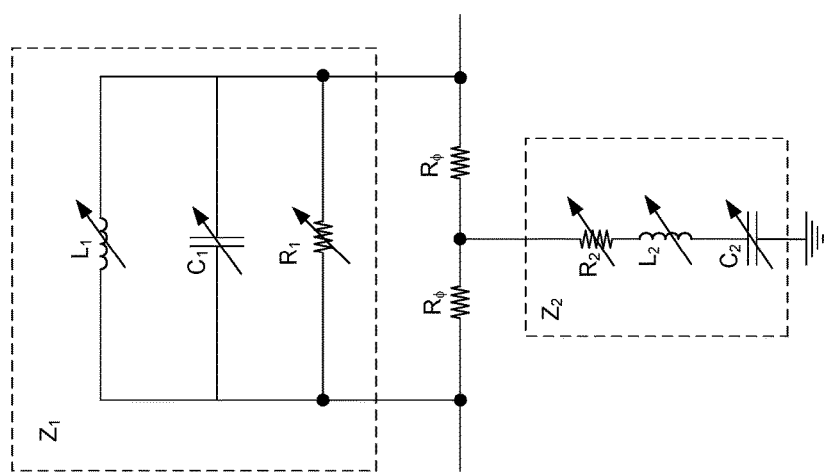
FIG. 9 is an illustration of another variable slope control circuit in accordance with an example embodiment of the disclosure.

FIG. 9 is an illustration of another variable slope control circuit in accordance with an example embodiment of the disclosure. Referring to FIG. 9, there is shown a second order variable slope equalizer 900. The equalizer 900 may be integrated in the ASCS 210 and/or 212 and may comprise impedance $Z_1$ in parallel with the resistors $R_\phi$, where the impedance $Z_2$ comprises the lower leg of the "T" structure. The impedance $Z_1$ may comprise variable inductor $L_1$, variable capacitor $C_1$, and variable resistor $R_1$. The impedance $Z_2$ may comprise inductor $L_2$ and variable resistor $R_2$.

In an example scenario, $Z_1 \cdot Z_2 = R_\phi^2 = R_1 \cdot R_2$, where the parallel and series LC circuits may be swapped to achieve a different attenuation profile. The variable inductors, capacitors, and resistors may comprise switched inductor/capacitor/resistor circuits on the chip comprising the receiver 200, the transceiver 600, and/or the receiver 700, and may be configured by the receiver processor 201, for example, thereby enabling dynamic frequency-dependent gain control of the ASCS 210 and/or 212. In another example scenario, one or more of the inductors, capacitors, or resistors may be off-chip.

In an embodiment of the disclosure, a method and system for digitization of broadband analog signals may comprise a radio frequency (RF) transceiver comprising a diplexer, first and second automatic gain and slope control (ASCS) modules operating over first and second frequency ranges, a combiner, and an analog to digital converter (ADC), the transceiver being operable to: receive an input RF signal comprising at least two signals, split the input RF signal in the frequency domain into first and second signals of different frequency utilizing the diplexer, configure a frequency-dependent gain level for each of the first and second signals utilizing the first and second ASCS modules, combine output signals from the first and second ASCS modules utilizing the combiner, and convert the combined output signals to a digital signal utilizing the ADC.

The frequency dependent gain levels of the first and second signals may be configured to enable the ADC to operate with an effective number of bits (ENOB) of approximately 10. The frequency dependent gain levels of the first and second signals may be configured to result in equal error margins for each signal. The frequency dependent gain levels of the first and second signals may be configured to result in equal total signal power for each signal. The frequency dependent gain levels of the first and second signals may be configured to result in equal power density for each signal. The frequency dependent gain levels of the first and second signals may be configured based on a type of modulation of the first and second signals.

The ASCS modules may comprise one or more of: low noise amplifiers, variable gain amplifiers, and step attenuators. The frequency dependent gain levels of the first and second signals may be dynamically configured. The first signal may comprise a Multimedia over Coax Alliance (MoCA) signal and the second signal may comprise a cable television signal. The MoCA signal may be time-duplexed with an output MoCA signal from a transmitter in the RF transceiver.

In an embodiment of the disclosure, a method and system for digitization of broadband analog signals may comprise a radio frequency (RF) transceiver comprising first and second automatic gain and slope control (ASCS) modules operating over different frequency ranges, a combiner, and an analog to digital converter (ADC): receiving an input RF signal comprising a Multimedia over Coax Alliance (MoCA) signal and a cable television signal, splitting the input RF signal in the frequency domain into a corresponding MoCA signal and a cable television signal, configuring a frequency-dependent gain level for each of the MoCA and cable television signals utilizing the first and second ASCS modules, combining output signals from the first and second ASCS modules utilizing the combiner, and converting the combined output signals to a digital signal utilizing the ADC.

Other embodiments of the disclosure may provide a non-transitory computer readable medium and/or storage medium, and/or a non-transitory machine readable medium and/or storage medium, having stored thereon, a machine code and/or a computer program having at least one code section executable by a machine and/or a computer, thereby causing the machine and/or computer to perform the steps as described herein for digitization of broadband analog signals.

Accordingly, aspects of the disclosure may be realized in hardware, software, firmware or a combination thereof. The disclosure may be realized in a centralized fashion in at least one computer system or in a distributed fashion where different elements are spread across several interconnected computer systems. Any kind of computer system or other apparatus adapted for carrying out the methods described herein is suited. A typical combination of hardware, software and firmware may be a general-purpose computer system with a computer program that, when being loaded and executed, controls the computer system such that it carries out the methods described herein.

One embodiment of the present disclosure may be implemented as a board level product, as a single chip, application specific integrated circuit (ASIC), or with varying levels integrated on a single chip with other portions of the system as separate components. The degree of integration of the system will primarily be determined by speed and cost considerations. Because of the sophisticated nature of modern processors, it is possible to utilize a commercially available processor, which may be implemented external to an ASIC implementation of the present system. Alternatively, if the processor is available as an ASIC core or logic block, then the commercially available processor may be implemented as part of an ASIC device with various functions implemented as firmware.

The present disclosure may also be embedded in a computer program product, which comprises all the features enabling the implementation of the methods described herein, and which when loaded in a computer system is able to carry out these methods. Computer program in the present context may mean, for example, any expression, in any language, code or notation, of a set of instructions intended to cause a system having an information processing capability to perform a particular function either directly or after either or both of the following: a) conversion to another language, code or notation; b) reproduction in a different material form. However, other meanings of computer program within the understanding of those skilled in the art are also contemplated by the present disclosure.

While the disclosure has been described with reference to certain embodiments, it will be understood by those skilled in the art that various changes may be made and equivalents may be substituted without departing from the scope of the present disclosure. In addition, many modifications may be made to adapt a particular situation or material to the teachings of the present disclosure without departing from its scope. Therefore, it is intended that the present disclosure not be limited to the particular embodiments disclosed, but that the present disclosure will include all embodiments falling within the scope of the appended claims.

What is claimed is:

1. A method for communication, the method comprising:
in a radio frequency (RF) transceiver comprising:
a diplexer with a first high pass filter and a first low pass filter,
a first automatic gain and slope control (ASCS) module operating over a first frequency range coupled to said first high pass filter at a first output of said diplexer,
a second ASCS module operating in a second frequency range coupled to said first low pass filter at a second output of said diplexer, and
a combiner comprising a second high pass filter coupled to an output of the first ASCS module and a second low pass filter coupled to an output of said second ASCS module,
receiving an input RF signal comprising at least two signals;
splitting the input RF signal in the frequency domain into first and second signals of different frequency utilizing the diplexer;
communicating the first and second signals of different frequency to the first and second ASCS module, respectively;
amplifying the first and second signals of different frequency utilizing the first and second ASCS modules, respectively, by configuring a frequency-dependent gain level for each of the first and second signals; and
combining output signals from the first and second ASCS modules utilizing the combiner.

2. The method according to claim 1, comprising configuring the frequency dependent gain levels of the first and second signals to enable an analog to digital converter (ADC) coupled to an output of the combiner to operate with an effective number of bits (ENOB) of approximately 10.

3. The method according to claim 1, comprising configuring the frequency dependent gain levels of the first and second signals to result in equal error margins for each signal.

4. The method according to claim 1, comprising configuring the frequency dependent gain levels of the first and second signals to result in equal total signal power for each signal.

5. The method according to claim 1, comprising configuring the frequency dependent gain levels of the first and second signals to result in equal power density for each signal.

6. The method according to claim 1, comprising configuring the frequency dependent gain levels of the first and second signals based on a type of modulation of the first and second signals.

7. The method according to claim 1, wherein each of the ASCS modules comprise one or more of: low noise amplifiers, variable gain amplifiers, and step attenuators.

8. The method according to claim 1, comprising dynamically configuring the frequency dependent gain levels of the first and second signals.

9. The method according to claim 1, wherein the first signal comprises a Multimedia over Coax Alliance (MoCA) signal and the second signal comprises a cable television signal.

10. The method according to claim 9, wherein the MoCA signal is time-duplexed with an output MoCA signal from a transmitter in the RF transceiver.

11. A system for communication, the system comprising:
a transceiver comprising:
a diplexer comprising a first high pass filter and a first low pass filter,
a first automatic gain and slope control (ASCS) module operating over a first frequency range coupled to said first high pass filter at a first output of said diplexer,
a second ASCS module operating in a second frequency range coupled to said first low pass filter at a second output of said diplexer, and
a combiner comprising a second high pass filter coupled to an output of said first ASCS module and a second low pass filter coupled to an output of said second ASCS module, said transceiver being operable to:
receive an input RF signal comprising at least two signals;
split the input RF signal in the frequency domain into first and second signals of different frequency utilizing the diplexer;
communicate the first and second signals of different frequency to the first and second ASCS modules, respectively;
amplify the first and second signals of different frequency using the first and second ASCS modules, respectively, by configuring a frequency-dependent gain level for each of the first and second signals; and
combine output signals from the first and second ASCS modules utilizing the combiner.

12. The system according to claim 11, wherein the transceiver is operable to configure the frequency dependent gain levels of the first and second signals to enable an analog to digital converter (ADC) coupled to an output of the combiner to operate with an effective number of bits (ENOB) of approximately 10.

13. The system according to claim 11, wherein said transceiver is operable to configure the frequency dependent gain levels of the first and second signals to result in equal error margins for each signal.

14. The system according to claim 11, wherein the transceiver is operable to configure the frequency dependent gain levels of the first and second signals to result in equal total signal power for each signal.

15. The system according to claim 11, wherein said transceiver is operable to configure the frequency dependent gain levels of the first and second signals to result in equal power density for each signal.

16. The system according to claim 11, wherein said transceiver is operable to configure the frequency dependent gain levels of the first and second signals based on a type of modulation of the first and second signals.

17. The system according to claim 11, wherein each of the ASCS modules comprise one or more of: low noise amplifiers, variable gain amplifiers, and step attenuators.

18. The system according to claim 11, wherein said transceiver is operable to dynamically configure the frequency dependent gain levels of the first and second signals.

19. The system according to claim 11, wherein the first signal comprises a Multimedia over Coax Alliance (MoCA)

signal, the second signal comprises a cable television signal, and the MoCA signal is time-duplexed with an output MoCA signal from a transmitter in the transceiver.

20. A system for communication, the system comprising:
a radio frequency (RF) transceiver comprising
- a first automatic gain and slope control (ASCS) module operating over a first frequency range coupled to a first high pass filter at a first output of a diplexer,
- a second ASCS module operating in a second frequency range coupled to a first low pass filter at a second output of said diplexer, and
- a combiner comprising a second high pass filter coupled to an output of said first ASCS module and a second low pass filter coupled to an output of said second ASCS module, said transceiver being operable to:
  - receive an input RF signal comprising a Multimedia over Coax Alliance (MoCA) signal and a cable television signal;
  - split the input RF signal in the frequency domain into a corresponding MoCA signal and a cable television signal;
  - communicate the MoCA signal and the cable television signal to the first and second ASCS modules, respectively;
  - amplify the MoCA signal and the cable television signal utilizing the first and second ASCS modules, respectively, by configuring a frequency-dependent gain level for each of the MoCA and cable television signals; and
  - combine output signals from the first and second ASCS modules utilizing the combiner.

* * * * *